(12) United States Patent
Zaiden et al.

(10) Patent No.: US 10,819,321 B1
(45) Date of Patent: Oct. 27, 2020

(54) SWITCHABLE ACTIVE BALANCED-TO-UNBALANCED PHASE SHIFTER

(71) Applicants: David Manuel Zaiden, Melbourne, FL (US); Thomas M. Weller, Lutz, FL (US); John E. Grandfield, Bourne, MA (US); Gokhan Mumcu, Tampa, FL (US)

(72) Inventors: David Manuel Zaiden, Melbourne, FL (US); Thomas M. Weller, Lutz, FL (US); John E. Grandfield, Bourne, MA (US); Gokhan Mumcu, Tampa, FL (US)

(73) Assignees: UNIVERSITY OF SOUTH FLORIDA, Tampa, FL (US); THE CHARLES STARK DRAPER LABORATORY, Cambridge, MA (US)

( * ) Notice: Subject to any disclaimer, the term of this patent is extended or adjusted under 35 U.S.C. 154(b) by 0 days.

(21) Appl. No.: 16/454,891

(22) Filed: Jun. 27, 2019

Related U.S. Application Data

(60) Provisional application No. 62/691,067, filed on Jun. 28, 2018.

(51) Int. Cl.
  *H03K 5/00* (2006.01)
  *H03H 11/32* (2006.01)
  *H03G 3/30* (2006.01)

(52) U.S. Cl.
  CPC .......... *H03K 5/00* (2013.01); *H03G 3/30* (2013.01); *H03H 11/32* (2013.01); *H03K 2005/00286* (2013.01)

(58) Field of Classification Search
  CPC ....................................................... H03K 5/00
  USPC .......................................................... 327/231
  See application file for complete search history.

(56) References Cited

U.S. PATENT DOCUMENTS

| | | | |
|---|---|---|---|
| 6,509,812 B2 | 1/2003 | Sayyah | |
| 8,680,945 B1 | 3/2014 | Wang | |
| 8,872,715 B2 | 10/2014 | Lea et al. | |
| 2008/0174501 A1 | 7/2008 | Licul et al. | |
| 2009/0315792 A1 | 12/2009 | Miyashita et al. | |
| 2010/0026419 A1 | 2/2010 | Hara et al. | |
| 2010/0148877 A1 | 6/2010 | Oakley et al. | |
| 2011/0267119 A1 | 11/2011 | Koechlin et al. | |

(Continued)

OTHER PUBLICATIONS

S. K. Garakoui, E. A. M. Klumperink, B. Nauta, and F. E. van Vliet, "Phased-array antenna beam squinting related to frequency dependency of delay circuits," in Proc. EuRad Conf., 2011, pp. 416-419.

(Continued)

*Primary Examiner* — Tomi Skibinski
(74) *Attorney, Agent, or Firm* — Thomas | Horstemeyer, LLP

(57) ABSTRACT

Disclosed is a phase shifter capable of achieving 360° phase shifts. The phase shifter includes an active balanced-to-unbalanced (balun) circuit for splitting an input signal into two signals offset in phase. The phase shifter further includes an active all-pass network electrically coupled to an output of the active balun circuit. The active all-pass network can include an active tunable inductor. A variable-gain amplifier (VGA) is electrically coupled to an output of the active all-pass network.

19 Claims, 15 Drawing Sheets

(56) References Cited

U.S. PATENT DOCUMENTS

| | | | |
|---|---|---|---|
| 2013/0176084 A1* | 7/2013 | Bao | H03H 7/21 333/126 |
| 2017/0201225 A1 | 7/2017 | Wang et al. | |
| 2017/0279174 A1 | 9/2017 | Du et al. | |

OTHER PUBLICATIONS

R. Amirkhanzadeh, H. Sjöland, J.-M. Redouté, D. Nobbe, and M. Faulkner, "Highresolution passive phase shifters for adaptive duplexing applications in SOS process," IEEE Trans. Microw. Theory Techn., vol. 62, No. 8, pp. 1678-1685, Aug. 2014.

X. Tang and K. Mouthaan, "Design of large bandwidth phase shifters using common mode all-pass networks," IEEE Microw. Wireless Compon. Lett., vol. 22, No. 2, pp. 55-57, Feb. 2012.

K.-J. Koh and G. M. Rebeiz, "0.13-μm CMOS phase shifters for X-, Ku-, and K-band phased arrays," IEEE J. Solid-State Circuits, vol. 42, No. 11, pp. 2535-2546, Nov. 2007.

Y. Zheng and C. E. Saavedra, "Full 360° vector-sum phase-shifter for microwave system applications," IEEE Trans. Circuits Syst. I, Reg. Papers, vol. 57, No. 4, pp. 752-758, Apr. 2010.

A. Asoodeh and M. Atarodi, "A full 360° vector-sum phase shifter with very low RMS phase error over a wide bandwidth," IEEE Trans. Microw. Theory Techn., vol. 60, No. 6, pp. 1626-1634, Jun. 2012.

S. P. Sah, X. Yu, and D. Heo, "Design and analysis of a wideband 15-35-GHz quadrature phase shifter with inductive loading," IEEE Trans. Microw. Theory Techn., vol. 61, No. 8, pp. 3024-3033, Aug. 2013.

H. Zijie and K. Mouthaan, "A 0.5-6 GHz 360° vector-sum phase shifter in 0.13-μm CMOS," in IEEE MTT-S Int. Microw. Symp. Dig., Jun. 2014, pp. 1-3.

Y. Kim, S. Kim, I. Lee, M. Urteaga, and S. Jeon, "A 220-320-GHz vector-sum phase shifter using single Gilbert-cell structure with lossy output matching," IEEE Trans. Microw.Theory Techn., vol. 63, No. 1, pp. 256-265, Jan. 2015.

C. Quan, S. Heo, M. Urteaga, and M. Kim, "A 275 GHz active vectorsum phase shifter," IEEE Microw. Wireless Compon. Lett., vol. 25, No. 2, pp. 127-129, Feb. 2015.

F. Ellinger, H. Jackel, and W. Bachtold, "Varactor-loaded transmissionline phase shifter at C-band using lumped elements," IEEE Trans. Microw. Theory Techn., vol. 51, No. 4, pp. 1135-1140, Apr. 2003.

S. Hamedi-Hagh and C. A. T. Salama, "A novel C-band CMOS phase shifter for communication systems," in Proc. Int. Symp. Circuits Syst., vol. 2. Bangkok, Thailand, May 2003, pp. II316-II319.

M. Teshiba, R. Van Leeuwen, G. Sakamoto, and T. Cisco, "A SiGe MMIC 6-bit PIN diode phase shifter," IEEE Microw. Wireless Compon. Lett., vol. 12, No. 12, pp. 500-501, Dec. 2002.

D. R. Banbury, N. Fayyaz, S. Safavi-Naeini, and S. Nikneshan, "A CMOS 5.5/2.4 GHz dual-band smart-antenna transceiver with a novel RF dual-band phase shifter for WLAN 802.11a/b/g," in IEEE RFIC Symp. Dig., Fort Worth, TX, USA, Jun. 2004, pp. 157-160.

I. J. Bahl and D. Conway, "L- and S-band compact octave bandwidth 4-bit MMIC phase shifters," IEEE Trans. Microw. Theory Techn., vol. 56, No. 2, pp. 293-299, Feb. 2008.

R. Bhattacharya, A. Basu, and S. K. Koul, "A highly linear CMOS active inductor and its application in filters and power dividers," IEEE Microw. Wireless Compon. Lett., vol. 25, No. 11, pp. 715-717, Nov. 2015.

L. H. Lu, H. H. Hsieh, and Y. T. Liao, "A wide tuning-range CMOS VCO with a differential tunable active inductor," IEEE Trans. Microw. Theory Techn., vol. 54, No. 9, pp. 3462-3468, Sep. 2006.

L.-H. Lu and Y.-T. Liao, "A 4-GHz phase shifter MMIC in 0.18-μm CMOS," IEEE Microw. Wireless Compon. Lett., vol. 15, No. 10, pp. 694-696, Oct. 2005.

T. Chen, S. Rodriguez, E. Alarcon, and A. Rusu, "A 2 GHz-8.7 GHz wideband Balun-LNA with noise cancellation and gain boosting," in Proc. IEEE PhD Res. Microelectron. Electron. (PRIME), Jun. 2012, pp. 1-4.

S.-C. Chou, F.-C. Huang, and C.-K. Wang, "A 60 GHz wideband active balun using magnitude and phase concurrent correction technique in 65 nm CMOS," in Proc. IEEE Asian Solid-State Circuits Conf., Nov. 2012, pp. 273-276.

S. C. Blaakmeer, E. A. M. Klumperink, D. M. W. Leenaerts, and B. Nauta, "Wideband Balun-LNA with simultaneous output balancing, noise-canceling and distortioncanceling," IEEE J. Solid-State Circuits, vol. 43, No. 6, pp. 1341-1350, Jun. 2008.

F. Yuan, "CMOS active inductors," in CMOS Active Inductors and Transformers, Principle, Implementation, and Applications, 1st ed. New York, NY, USA: Springer, 2008, pp. 21-98.

R. Akbari-Dilmaghani, A. Payne, and C. Toumazou, "A high Q RF CMOS differential active inductor," in Proc. IEEE ISCAS, vol. 3. Sep. 1998, pp. 157-160.

C.-L. Ler, A. K. bin A'ain, and A. V. Kordesch, "Compact, high-Q, and low-current dissipation CMOS differential active inductor," IEEE Microw. Wireless Compon. Lett., vol. 18, No. 10, pp. 683-685, Oct. 2008.

F. Belmas, F. Hameau, and J.-M. Fournier, "A new method for performance control of a differential active inductor for low power 2.4 GHz applications," in Proc. IEEE Int. Conf. Integr. Circuits Design Technol., Jun. 2010, pp. 244-247.

M. Abdalla, G. V. Eleftheriades, and K. Phang, "A differential 0.13 μm CMOS active inductor for high-frequency phase shifters," in Proc. IEEE Int. Symp. Circuits Syst. (ISCAS), May 2006, pp. 3341-3344.

M.-M. Mohsenpour and C. E. Saavedra, "Variable 360° vector-sum phase shifter with coarse and tine vector scaling," IEEE Trans. Microw. Theory Techn., vol. 64, No. 7, pp. 2113-2120, Jul. 2016.

J.-C. Jeong, D. Shin, I. Ju, and I.-B. Yom, "An S-band multifunction chip with a simple interface for active phased array base station antennas," ETRI J., vol. 35, No. 3, pp. 378-385, Jun. 2013.

A. P. de Hek, M. Rodenburg, and F. E. van Vliet, "Low-cost S-band multi-function MMIC," in Proc. Eur. Microw. Integr. Circuit Conf., Oct. 2008, pp. 262-265.

M. Hangai, M. Hieda, N. Yunoue, Y. Sasaki, and M. Miyazaki, "S- and C-band ultracompact phase shifters based on all-pass networks," IEEE Trans. Microw. Theory Techn., vol. 58, No. 1, pp. 41-47, Jan. 2010.

C. Lu, A.-V. H. Pham, and D. Livezey, "Development of multiband phase shifters in 180-nm RF CMOS technology with active loss compensation," IEEE Trans. Microw. Theory Techn., vol. 54, No. 1, pp. 40-45, Jan. 2006.

T. M. Hancock and G. M. Rebeiz, "A 12-GHz SiGe phase shifter with integrated LNA," IEEE Trans. Microw. Theory Techn., vol. 53, No. 3, pp. 977-983, Mar. 2005.

\* cited by examiner

| $gm$ | $L$ | $R_s$ | $\omega p$ | $\omega z$ |
|---|---|---|---|---|
| ↑ | ↓↓ | ↓↓ | ↑ | ↓ |
| ↓ | ↑↑ | ↑↑ | ↓ | ↑ |
| $R_f$ | $L$ | $R_s$ | $\omega p$ | $\omega z$ |
| ↑ | ↓ | ↓ | ↑ | ↓↓ |
| ↓ | ↑ | ↑ | ↓ | ↑↑ |

FIG. 9

| Transistor | W/L$_t$, μm/μm | Number of Fingers |
|---|---|---|
| M11, M12 | 130/0.5 | 2 |
| M13, M14 | 50/0.5 | 2 |
| M15, M16 | 100/0.5 | 2 |

FIG. 10

| | [28] | [29] | [30] | [31] | [32] | This work |
|---|---|---|---|---|---|---|
| Technology | 0.5 um pHEMT | 0.5 um pHEMT | 0.5 um pHEMT | 0.18 um CMOS | SiGe | 0.5 um pHEMT |
| Frequency (GHz) | 1.8 – 3.2 | 2.5 – 3.5 | 0.85 – 1.15 | 3.4-3.5 | 10-13 | 1.5 – 3 |
| Phase Control | 360°/6 bits | 360°/6 bits | 360°/5 bits | 360°/6 bits | 360°/4 bits | 360°/5 bits |
| Gain (dB) | 26 | 28 | -6.5 | -5.4 | 3.7 | 10 |
| RMS Phase Error (deg.) | <6 | <3 | <7 | 3 | - | <9 |
| RMS Gain Error (dB) | <1 | - | <1.5 | <2 | - | <1.5 |
| Power (mW) | 500 | not reported | 21 | - | 54 | 78 |
| P-1dB (dBm) | 12 | 19 | 10 | - | -27.3 | 12 |
| Fractional Bandwidth (%) | 56 | 22 | 10 | 3 | 6 | 67 |
| Size (mm²) | 4 × 4 | 5.5 × 5.5 | 1.87 × 0.87 | 1.2 × 2.3 | 1.92 × .78 | 2.7 × 4.5 |

SWITCHABLE ACTIVE BALANCED-TO-UNBALANCED PHASE SHIFTER

CROSS-REFERENCE TO RELATED APPLICATIONS

This application claims the benefit of and priority to U.S. Provisional Patent Application No. 62/691,067, filed on Jun. 28, 2018, entitled "Switchable Active Balanced-To-Unbalanced Phase Shifter" the contents of which is incorporated by reference herein in its entirety.

BACKGROUND

Phase shifters are key components of electronically scanned antenna arrays (ESAs). Their phase resolution capabilities and phase/amplitude errors affect the precision achieved in radiation beam direction and the magnitude of the side lobes. The high number of tightly spaced antenna elements within an ESA dictates the use of compact, low-cost, and power efficient phase shifter components.

BRIEF DESCRIPTION OF THE DRAWINGS

The foregoing will be apparent from the following more particular description of example embodiments of the present disclosure, as illustrated in the accompanying drawings in which like reference characters refer to the same parts throughout the different views. The drawings are not necessarily to scale, emphasis instead being placed upon illustrating embodiments of the present disclosure.

FIG. 3A illustrates an example of a graphical representation of the simulated performance of the active balun with the Si 1, and FIG. 3B illustrates an example of a graphical representation of the simulated performance of the active balun showing the phase difference and gain error between the 0° and 180° states.

FIG. 9 illustrates a table showing the effects of varying transconductance and feedback resistance on performance of the tunable active inductor according to various embodiments of the present disclosure.

FIG. 10 illustrates a table showing transistor sizes of the optimized tunable active inductor according to various embodiments of the present disclosure.

FIG. 17A illustrates a design layout of the fabricated phase shifter. FIG. 17B illustrates a microphotograph of the fabricated phase shifter.

FIG. 19 illustrates a table comparing the measured performance of the phase shifter with the known phase shifters according to various embodiments of the present disclosure.

FIG. 20A illustrates a graphical representation of the phase response and rms phase error. FIG. 20B illustrates a graphical representation of the gain and rms gain error. FIG. 20C illustrates a graphical representation of the S11 and S22.

DETAILED DESCRIPTION OF EMBODIMENTS

Figure 1:
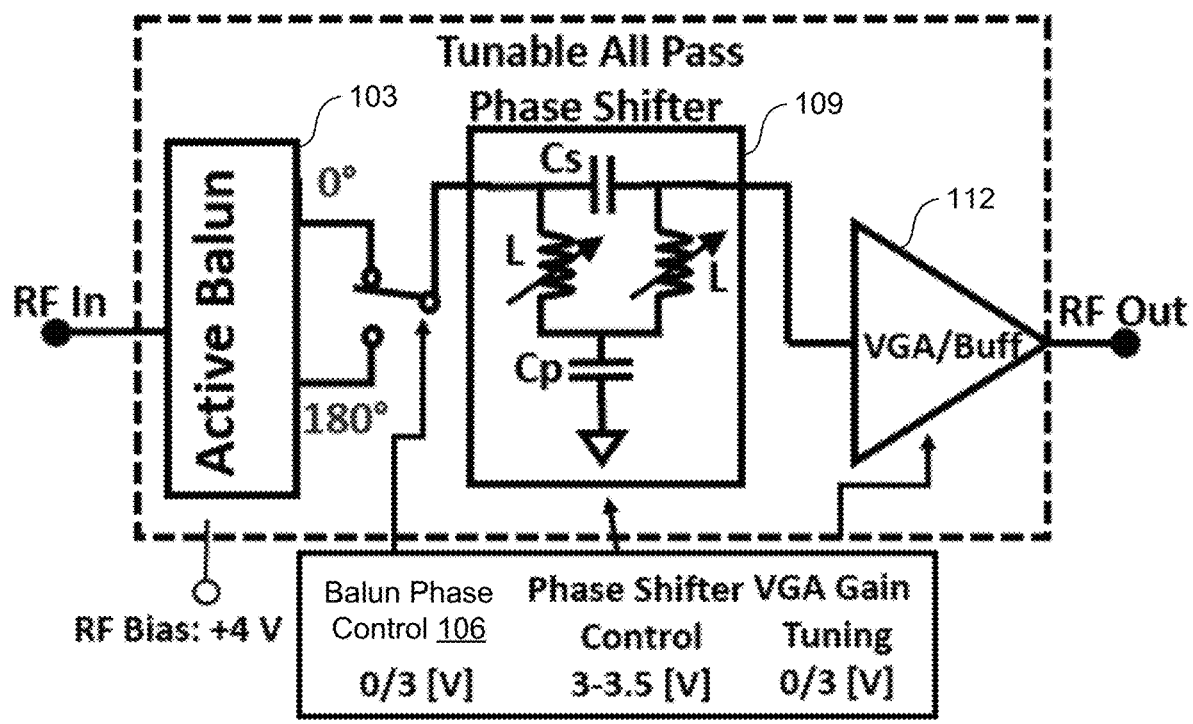
FIG. 1 an example of a functional block diagram of a phase shifter according to various embodiments of the present disclosure.

The present disclosure relates to a phase shifter that is operable over a wide bandwidth with full 360° phase shift capability according to various embodiments of the present disclosure. According to various embodiments of the present disclosure, the phase shifter comprises a switchable active balanced-to-unbalanced (balun) phase shifter and utilizes floating tunable active differential inductors within all-pass networks. The presented phase shifter exhibits a remarkable bandwidth performance from a very compact footprint with low power consumption. The phase shifter of the present disclosure further presents an alternative for the implementation of wideband phase shifters where all-passive implementations will consume too much expensive chip real estate.

According to various embodiments of the present disclosure, the switchable active balun circuit comprises transistor switches on each signal path. The circuit functions by taking an input signal and splitting it into two equal amplitude signals that are ideally 180° apart in phase. It uses a common gate (CG) transistor and a common-source (CS) transistor to provide a wideband input impedance. To utilize only one of the outputs based on the desired phase shift, switches are placed on each of the output branches. The switches are implemented using large single enhancement mode transistors to minimize series resistance. The gates of the switches are biased with 1.5-kΩ resistors to improve isolation. Buffers in the form of common-source transistors are implemented at the output to isolate the balun from the input of the next stage and also serve to combine both signals into a single output at either 0° or 180°.

To address the challenging needs of small size, wide bandwidth, and low-frequency applicability, the phase shifter implementation of the present disclosure utilizes tunable active differential inductors within all-pass networks. The inductor tuning is used to achieve phase shifts up to 180°. The switchable active balanced-to-unbalanced transition (balun) circuit is included in front of the all-pass network to complement its phase shift capability by another 180°. In addition, the all-pass network is followed by a variable-gain amplifier to correct for gain variations among the phase shifting states and act as an output buffer. Although active inductors have previously been used in the design of various components, active inductors are not known to have been used in an all-pass phase shifter.

The approach is demonstrated with an on-chip design and implementation exhibiting wideband performance for S- and L-band applications by utilizing the 0.5-µm TRIQUINT® pseudomorphic high electron mobility transistor (pHEMT) Gallium Arsenide (GaAs) monolithic microwave integrated circuits (MMIC) process. Specifically, the presented phase shifter 1×3.95 mm² die area and operates within the 1.5-3-GHz band (i.e., 2:1 bandwidth) with 10-dB gain, less than 1.5-dB root-mean-square (rms) gain error and less than 9° rms phase error. Comparison with the state-of-the-art MMIC phase shifters operating in S- and L-bands demonstrates that the presented phase shifter exhibits a remarkable bandwidth performance from a very compact footprint with low-power consumption. Consequently, it presents an alternative for the implementation of wideband phase shifters where all-passive implementations will consume expensive chip real estate.

Phase shifters are key components of electronically scanned antenna arrays (ESAs). Their phase resolution capabilities and phase/amplitude errors affect the precision achieved in radiation beam direction and the magnitude of the side lobes. The high number of tightly spaced antenna elements within an ESA dictates the use of compact, low-cost, and power efficient phase shifter components. On the other hand, emerging applications operating across multiple frequency bands or over wide frequency ranges impose new challenges for phase shifters due to the well-known tradeoffs among cost, size, performance, and bandwidth. Achieving wide bandwidth operation from a compact and low-cost on-chip phase shifter is especially challenging in the lower microwave band due to the size of inductors and any distributed components. To address the miniaturization needs, many known phase shifter designs in the past decade have been done at the chip level. These implementations have mostly been carried out with GaAs processes and provided monolithic microwave integrated circuit (MMICs) capable of achieving complete 360° phase shifts. The design techniques for these MMICs include utilization of digital high-pass/low-pass and all-pass passive networks, performing vector summations [i.e., amplitude and phase control by changing the amplitude of I/Q signals using variable gain amplifiers (VGAs)] and using switchable and variable delay lines. More recently, silicon (Si)-based phase shifters have attracted interest due to cost advantages. The majority of these designs have been primarily based on the techniques previously established with the GaAs implementations. For example, a known 360° phase shifter uses a varactor-tuned ladder network to operate at 8 GHz, A 6-b digital phase shifter covering the 7-11 GHz band has been implemented in SiGe. A 4-b dual-band phase shifter for 5.2/2.4-GHz applications is known. The design combines two single-band phase shifters that utilize VGAs to perform vector summations.

For wideband phase shifter applications, high-pass/low-pass and all-pass network-based phase shifters are mostly preferred due to their ability to provide constant phase shift over an octave or more. Fully integrated versions of these passive phase shifters are quite common, having minimal power consumption and high linearity but suffering from high insertion loss. In addition, their wideband design necessitates the use of higher order networks with an increased number of passive inductor/capacitor components, penalizing the insertion loss further. Most importantly, realizing such wideband phase shifters at low microwave frequencies (e.g., below 10 GHz) contradicts with the miniaturization need—an attribute not desirable for on-chip implementations. On the other hand, vector summation techniques reduce chip area but do not provide the wideband characteristics of high-pass/low-pass phase shifters. Vector-sum phase shifters also require the use of a quadrature splitter at the input. This splitter is usually implemented using resistor/capacitor polyphaser filters which consist of cascaded resistor/capacitor-capacitor/resistor networks to extend the bandwidth and minimize amplitude variation between the in-phase and quadrature-phase paths. At lower gigahertz frequencies, the resistor and capacitor values would be prohibitively large and require many stages to achieve wideband performance. Quadrature-phase accuracy is also determined by component matching between in-phase and quadrature-phase paths, and these paths require large layout areas for the resistors and capacitors.

To address the challenging needs of small size, wide bandwidth, and low-frequency applicability, a novel phase shifter implementation is disclosed that combines the wide bandwidth performance of all-pass networks with tunable active differential inductors. The implementation also utilizes an active balanced-to-unbalanced (balun) transition-based 180° phase shifting circuit block and a VGA to provide a complete 360° phase shift range with low root-mean-square (rms) gain and phase error. Although active inductors have been previously used in the design of filters, power dividers, voltage controlled oscillators, and artificial transmission lines, this is the first known time that active inductors have been used to implement all-pass network-based phase shifters. The feasibility of the approach is demonstrated with an on-chip design and implementation by utilizing a 0.5-µm TRIQUINT® pHEMT GaAs process for S- and L-band applications. Specifically, the presented phase shifter has 1×3.95 mm² die area and operates within the 1.5-3-GHz band (i.e., 2:1 bandwidth) with 10-dB gain, less than 1.5-dB rms gain error and less than 9° rms phase error.

Functional Block Diagram

FIG. 1 illustrates an example of the functional block diagram of the phase shifter 100 according to various embodiments of the present disclosure. The first stage is composed of an active balanced-to-unbalanced (balun) circuit 103 followed by a single-pole double-throw switch 106. The balun 103 is designed to provide a wideband 50-Ω impedance match at the RF input and reduce the insertion loss of the phase shifter by providing gain. The balun 103 functions as a switched 180° phase shifter bit to complement the phase shift that is attained in the second stage. Therefore, accuracy in both phase and amplitude performance of the balun 103 is crucial as it directly contributes to the overall performance of the phase shifter 100.

The second stage of the phase shifter 100 is an all-pass network 109 implemented using active inductors. All-pass networks 109 are attractive for large phase shift bandwidths. It is typical to use them in digital implementations by including two switchable all-pass network blocks to form a phase shift bit (e.g., a 22.5° bit). The complete phase shifter generally includes 4-6 such bits. However, implementation of this type of phase shifter causes the circuit area to be dominated by passive inductors, not only by the physical size of each inductor but also the spacing needed between them to reduce mutual coupling to an acceptable level. Therefore, the all-pass network 109 of the present disclosure is based on an active tunable inductor that is compact and eliminates the need for several all-pass network blocks. The shunt inductor all-pass configuration of FIG. 1 requires identical inductance values for its inductors and is therefore chosen over the shunt capacitor design. The selected active inductor-based all-pass network 109 implementation provides continuous adjustment of the phase shift within 0°-180° from 1.5 to 3 GHz through a control voltage.

The third and final component of the functional block diagram of FIG. 1 comprises a two stage VGA 112 that also acts as an output buffer. The first stage of the VGA 112 is a common-gate (CG) amplifier that provides a constant load impedance to the output of the active all-pass network 109. The second stage is another CG amplifier with a variable bias resistor network in order to adjust the amplifier gain to balance the gain variations among the phase shift values. The output buffer at the end of the circuit is designed to provide a wideband 50-Ω match at the output. The following sections detail the design of each of the blocks within the proposed phase shifter 100 with specific emphasis on the tradeoffs between tenability, bandwidth, and achievable phase shift associated with inclusion of active inductors within the all-pass network 109.

Active Balun-Based 180° Phase Shifter

Figure 2A:
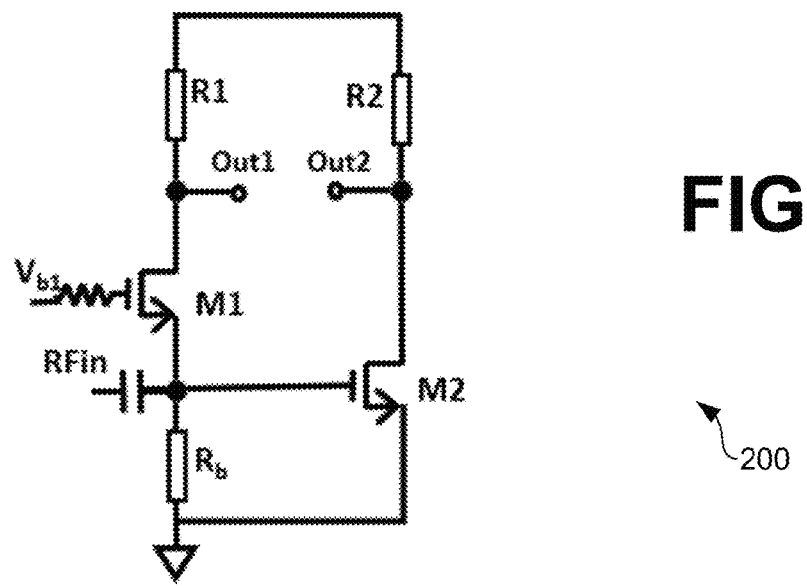
FIG. 2A is an example of a single-to-differential circuit topology used to implement an active balun according to various embodiments of the present disclosure.

The single-to-differential circuit topology shown in FIG. 2A has been extensively used to implement an active balun 200. This circuit shows reliable performance with moderate noise figure (<3.8 dB), good linearity (Pin1 dB≈0 dBm), wideband input match (1.5-3 GHz), and balanced outputs. The circuit functions by taking an input signal and splitting it into two equal amplitude signals that are ideally 180° apart in phase. It uses a CG transistor M1 and a common-source (CS) transistor M2 to provide a wideband input impedance ($R_{in}$) given as $$R_{in} = \frac{1}{gm_1} \| R_b \quad (1)$$

where $R_b$ and $gm_1$ are the source resistor and transconductance of M1, respectively, $R_b$ also serves to provide a bias voltage to M2. Selecting a large $R_b$ value results in an $R_{in}$ value that is dominated by the $$\frac{1}{gm_1}$$

term. In addition, for this case, the voltage gains of the two branches ($Av_{CG}$ and $Av_{CS}$ are simplified as $$Av_{CG}=gm_1 \times R1 \quad Av_{CS}=gm_2 \times R2 \quad (2)$$

where $gm_2$ represents the transconductance of M2. R1 and R2 are the load resistors of M1 and M2, respectively. Equation (2) shows that for this topology to function as a balun, M1 and M2 must have identical transconductance and load resistor products. For this, the load resistors are selected to be equal as R1=R2=500Ω. Since large values of $R_b$ in the 400-700Ω range imply $$R_{in} \approx \frac{1}{gm_1},$$

$gm_1$ is selected as 27 ms to achieve a 50-Ω input impedance. Consequently $gm_2$ is selected to be identical with $gm_1$ to achieve equal powers at the outputs with 180° phase difference.

Figure 2B:
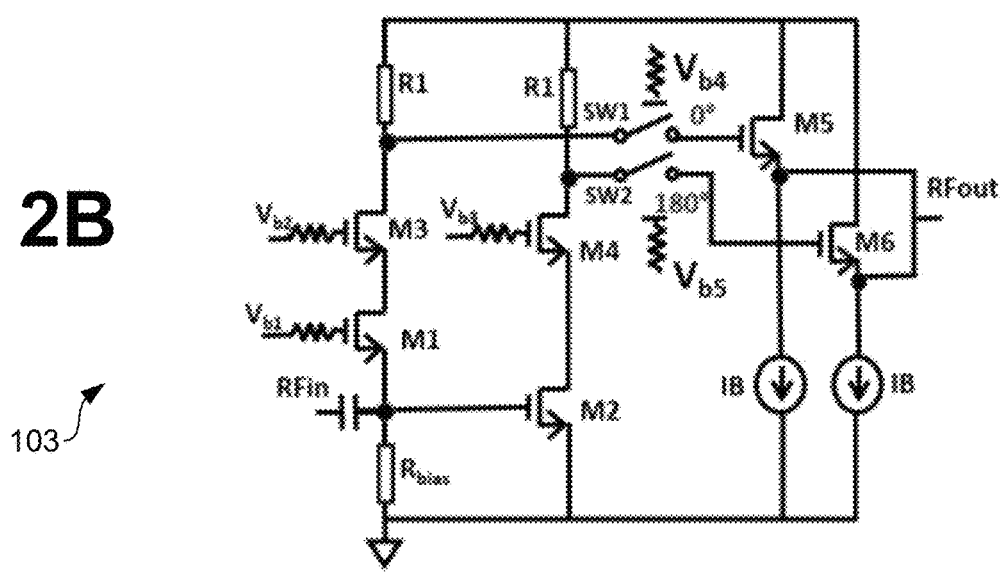
FIG. 2B depicts an example of the active balun implementation within a proposed phase shifter according to various embodiments of the present disclosure.
Figure 3A:
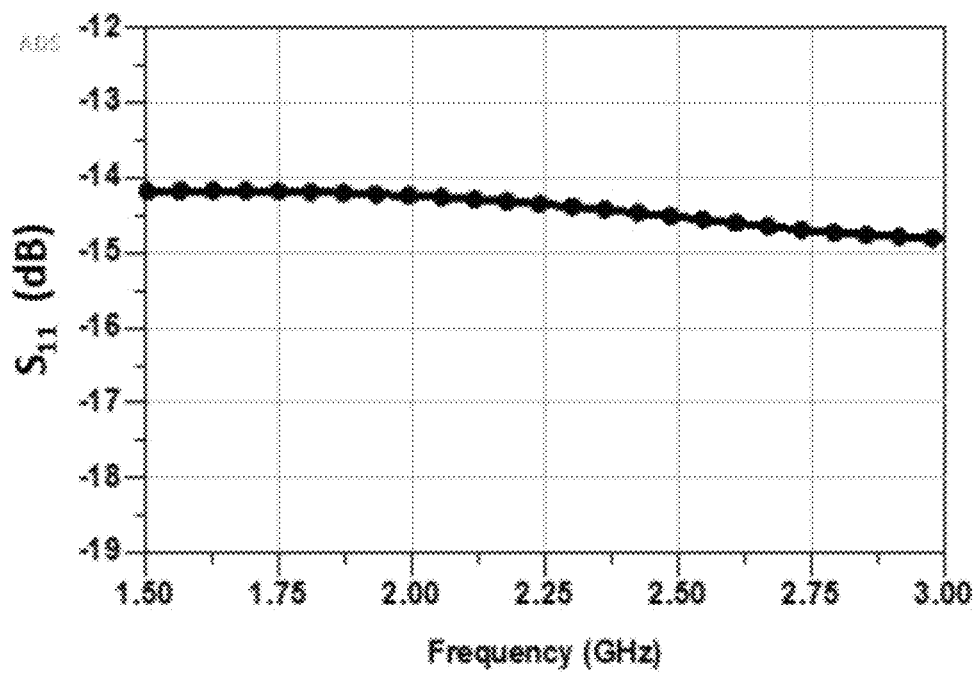
FIGS. 3A and 3B illustrate examples of graphical representations of the simulated performance of the active balun of FIG. 2B according to various embodiments of the present disclosure. In particular.
Figure 3B:
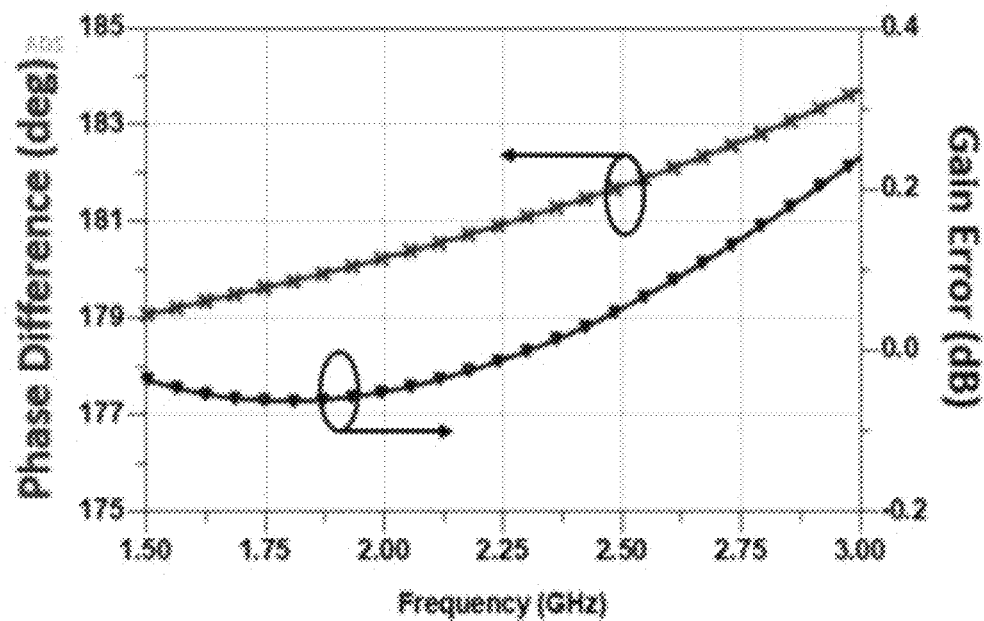

FIG. 2B depicts an example of an active balun 103 within the phase shifter 100 according to various embodiments of the present disclosure. Transistors M3 and M4 form a cascade topology which provides higher isolation from output to input by eliminating the Miller effect with bias voltages $V_{b1}$, $V_{b2}$, and $V_{b3}$ set to 1.3, 1.8, and 1.8 V, respectively. To utilize only one of the outputs based on the desired phase shift, switches SM1 and SW2 are placed on each of the output branches. The switches are implemented using large single enhancement mode transistors with width/length (W/$L_t$) of 100/0.5 μm and two fingers to minimize series resistance. The gates of the switches are biased with 1.5-kΩ resistors to improve isolation. Simulation results show a worst case insertion loss of 1.1 dB and isolation of 26.8 dB at 1.5 GHz. Unlike existing similar designs, switching the balun output does not result in input impedance variation as none of the transistors get completely shut off. Specifically, both branches are always active since M1-M4 are kept in saturation and phase change are controlled by switches at the output. This results in higher current consumption (~4.5 mA) but averts the critical issues of input impedance matching variations between different phase states. The buffers are implemented to isolate the balun 103 from the input of the active all-pass phase shifter stage where bias currents (IB) are implemented using current mirrors. Keysight Advanced Design System (ADS) schematics and full-wave Momentum layout simulations were utilized in combination with post layout tuning to obtain the S11, gain error, and phase difference performances shown in FIGS. 3A-3B. In particular, FIG. 3A illustrates an example of a graphical representation of the simulated performance of the active balun 103 with the S11. FIG. 3B illustrates an example of a graphical representation of the simulated performance of the active balun 103 showing the phase difference and gain error between the 0° and 180° states. The gains of the two phase shift states were equalized by tuning the load resistors.

Figure 4:
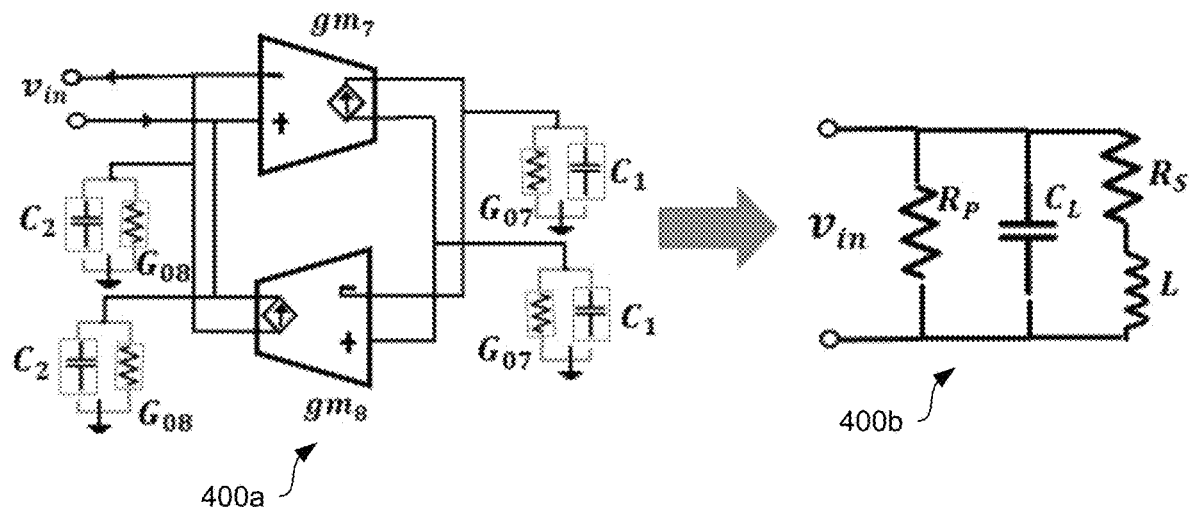
FIG. 4 illustrates an example of a floating gyrator-C active inductor and its RF equivalent circuit model according to various embodiments of the present disclosure.

In addition, although transistors M1-M4 were initially sized the same (W/L 30/0.5 μm with two fingers), the sizes of M2 and M4 were subsequently decreased (W/L 26/0.5 μm with two fingers). This strategy works well for compensating the lack of symmetry between the two signal paths. As seen, the circuit is well matched and S11 is maintained below −14 dB. The gain error between the two phase shift states is between −0.1 and 0.25 dB with the average gain being 10 dB. The phase error is below 4° across the 1.5 to 3 GHz frequency of interest. The active balun has a worst case switching time of 2.3 ns that was not affected by sweeping the inductance value of active inductor-loaded all-pass network, Active Inductor-Loaded all-Pass Network The gyrator-C network 400a shown in FIG. 4 comprises a back-to-back connection of two transistors and operates as a floating active inductor. In this network, $C_i$ (i=1, 2) and $G_{oj}$ (j=7,8) represent the total parasitic capacitance and conductance at the input-output and output/input nodes of the transistors M7/M8, respectively. FIG. 4 also depicts the RF equivalent circuit model 400b corresponding to the gyrator-C network 400a. The finite values of these conductances result in loss and limit the frequency range over which the network acts as an active inductor. The RF equivalent circuit 400b consists of parasitic parallel resistance ($R_p$), parallel capacitance ($C_L$), series resistance ($R_s$), and inductance (L).

A Bode plot of this impedance shows that the inductance response of the network is frequency limited and dictated by the parasitic resistance of the network 400a, Specifically, for a typical condition of $R_p \gg R_s$ the pole and zero frequencies (i.e., co p and ωz) occur at $$\omega p \approx \sqrt{\frac{1}{C_L L}} \quad (5)$$

$$\omega z = \frac{R_s}{L}$$

These denote the upper and lower bounds of the frequency range, respectively. Due to $R_p \gg R_s$, the quality factor (Q) of the active inductor also becomes $$Q = \frac{\omega L}{R_s} \quad (4)$$

Figure 5:
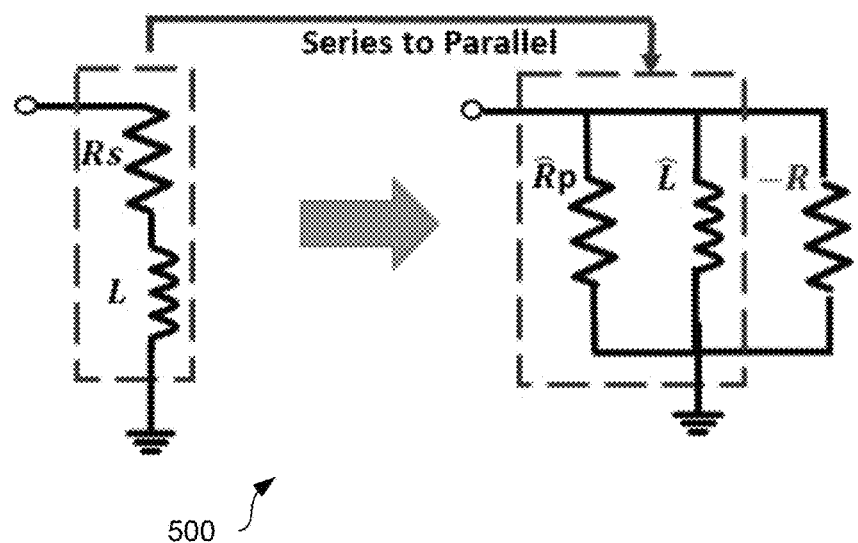
FIG. 5 illustrates an example of a circuit that revises the RF equivalent circuit of the gyrator-C network of FIG. 4 by replacing the series $R_s$–L branch with parallel $\hat{R}p$ and $\hat{L}$ branches according to various embodiments of the present disclosure.
Figure 6:
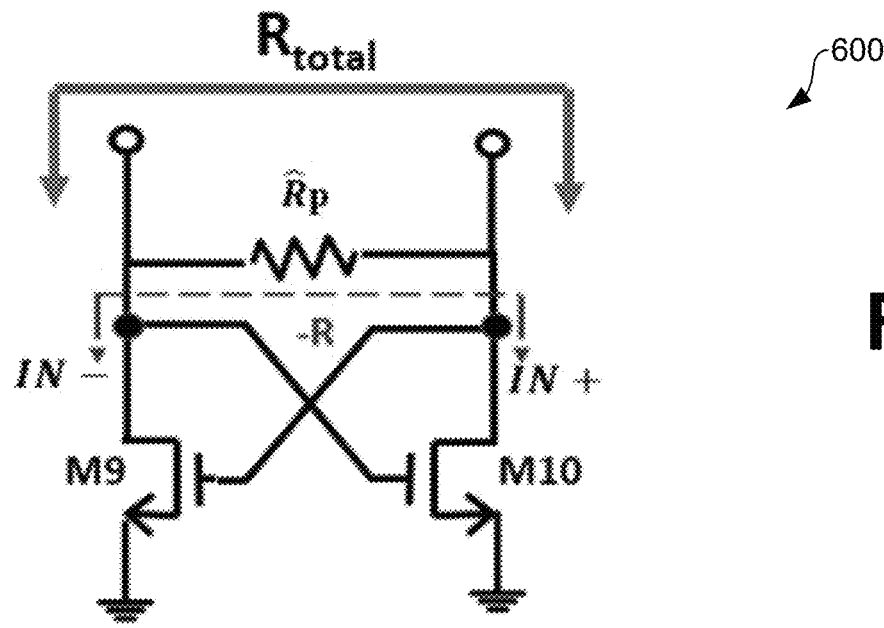
FIG. 6 illustrates an example of a circuit showing negative resistance cross-coupled transistors according to various embodiments of the present disclosure.

Specifically, ωz is minimized by decreasing $R_s$ which also serves to increase Q. This can be achieved by properly sizing transistors or using cascode transistors to reduce output conductance $G_{o7}$. Additional operational frequency range can be obtained by using a feedback resistor. This feedback resistor introduces an additional zero to cancel the dominant pole. The approach allows for large values of capacitors $C_L$ without limiting the maximum range of frequency where the system behaves like an inductor. The Q of the active inductor can be further increased by introducing a shunt negative resistor to the input of the gyrator-c network 400a to cancel out the parasitic resistance seen in its RF equivalent circuit 400b. This can be seen from the circuit model 500 in FIG. 5 that revises the RF equivalent circuit 400b of the gyrator-C network 400a by replacing the series $R_s$-L branch with parallel $\hat{R}p$ and $\hat{L}$ branches. To implement the negative R that will be used to cancel $\hat{R}p$, two cross coupled equally sized transistors can be employed as shown in FIG. 6. The negative resistance and total resistance of this network are given by $$-R = -\left(\frac{1}{gm_9} + \frac{1}{gm_{10}}\right) \quad (5)$$

$$R_{total} = \hat{R}p \| -R$$

Figure 7:
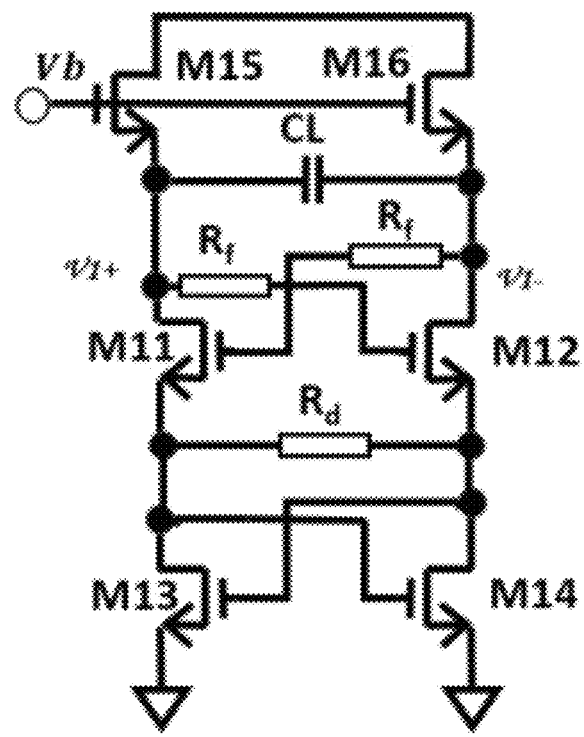
FIG. 7 illustrates an example of an active inductor circuit according to various embodiments of the present disclosure.

FIG. 7 depicts an example schematic of the active inductor circuit 700 for implementing the aforementioned strategies for improved quality factor and frequency range. This schematic also represents the circuit that constitutes the active inductors 700 of the all-pass network 109 employed within the phase shifter 100 of the present disclosure. This source-degenerated differential active inductor (DAI) design comprises two cross-coupled E-mode PHEMT transistors M11 and M12 to realize the gyrator-C network. Feedback resistors R f enlarge the frequency range, reduce the series RF resistance, and increase the inductance. Transistors M13 and M14 form the negative resistance circuit to improve the quality factor. Inductance tunability is achieved by varying the $gm_{11}$ and $gm_{12}$ values of the cross-coupled transistors M11 and M12, respectively. To do so, tuning voltage ($V_b$) on transistors M15 and M16 are utilized for current adjustment. Due to the feedback resistors, the RF equivalent circuit parameters of the active inductor becomes $$L = \frac{C_L}{\alpha(gm_{11}gm_{12})} \quad (6)$$

$$R_s = \frac{\frac{1}{R_T}\omega p^2 \cdot Cgs_{11,12} \cdot C_L \cdot R_f}{gm_{11} \cdot gm_{12}} \quad (7)$$

$$R_T = R_f \| R_d \| ro_{11,12} \| ro_{13,14} \quad (8)$$

where a represents the voltage attenuation factor (between 0 and 1) introduced by the feedback resistors, ωp is the frequency in Equation (3), $ro_{11,12}$ is the output resistance of transistors M11 and M12, $ro_{13,14}$ is the net negative resistance of M13 and M14, and $C_L$ is the load capacitor. $Cgs_{11,12}$ is the sum of the gate to source capacitances of M11 and M12. In the case $R_s$ becomes negligible because of the negative resistance network, the quality factor of the active inductor is determined by the parallel resistance $R_p$ in FIG. 4, and Equation (4) becomes $$Q \approx \frac{R_p}{\omega L} \quad (9)$$

Active inductors implemented using the gyrator-c topology are negative feedback systems and stability should also be considered. Classifying the gyrator-c active inductor shown in FIG. 4 as a second-order system, the damping factor is given by $$\xi = \frac{1}{2\sqrt{gm_7 gm_8}}\left(\sqrt{\frac{C_2}{C_1}} + \sqrt{\frac{C_1}{C_2}}\right) \quad (10)$$

Increasing $gm_7$ or $gm_8$ will lead to a decrease in the damping factor resulting in a decrease in stability. Resistor $R_d$ in FIG. 7 thus becomes mandatory for unconditional stability ensuring that the resistance of the system stays positive.

Figure 8A:
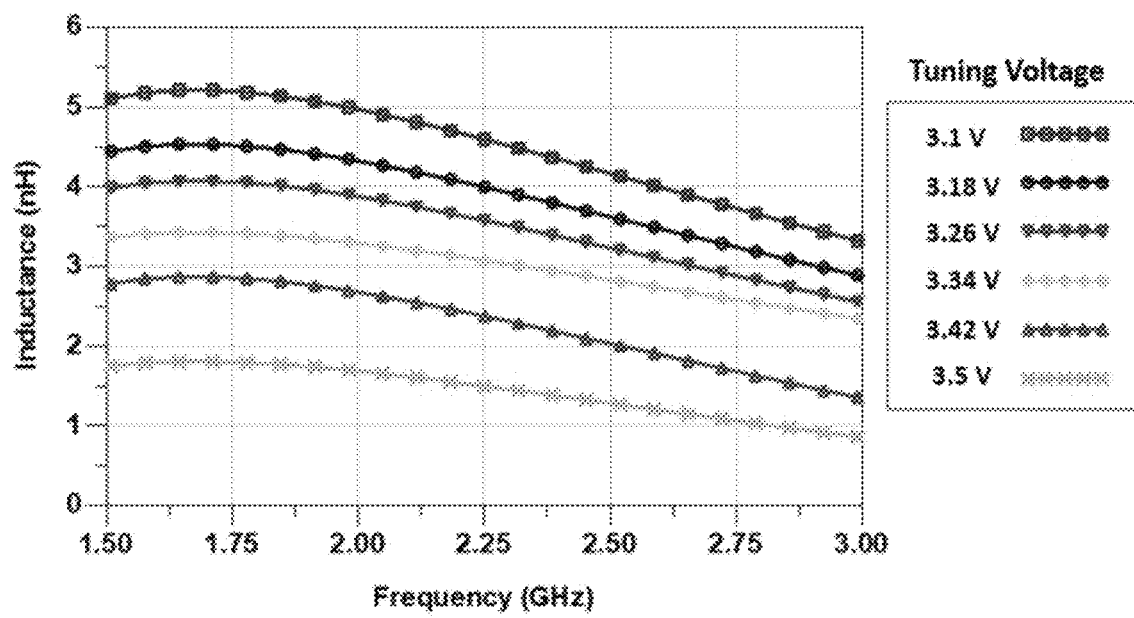
FIG. 8A illustrates an example graphical representation of the inductance tuning range of the active inductor circuit of FIG. 7 according to various embodiments of the present disclosure.

To utilize the active inductor circuit 700 shown in FIG. 7 within the all-pass network 109 for phase shifting purposes, the first step is to determine the inductance variation required to achieve a 180° phase shift range within the frequency band of interest. For this, the following design equations can be employed:

$$L = \frac{p \cdot Z_0}{\omega} \quad (11)$$

$$p = \frac{1}{2}\tan\left(\frac{\phi}{4}\right) + \sqrt{1 + \frac{1}{4}\tan\left(\frac{\phi}{4}\right)^2}$$

where $Z_0$ is the characteristic impedance and $\phi$ denotes the phase shift in radians. Equation (11) shows that there is a linear relationship between the value of the characteristic impedance $Z_0$ and the inductance value L. For 1.5-GHz operation and 180° phase shift, a 50-Ω characteristic impedance results in an inductance tuning range from 3.2 to 8.6 nH. However, trying to implement an active inductor with this tuning range by following the approach outlined in the following paragraphs fans due to the large inductance value and inductance variation ratio. Since the active inductor-loaded all-pass network 109 is preceded by the active balun 103 and followed by the output VGA/buffer 112, it does not directly interact with the external 50-Ω connections and allows the freedom of choosing a lower characteristic impedance to minimize the required active inductance tuning range. Based on the inductance values obtainable from the active inductor, the impedance of the all-pass network 109 was reduced. Consequently, buffers were needed at the output of the balun 103 to provide the required impedance. Increased power consumption was therefore unavoidable when implementing this approach with a reduced characteristic impedance. Nevertheless, the quality factor was improved by including the shunt negative resistor network 600 as described above and shown in FIG. 6. The desired inductances were achievable when the all-pass network 109 was designed with a 25-Ω impedance with the required inductance tuning range being 1.6 to 4.3 nH and 0.9 to 2.2 nH at 1.5 and 3 GHz, respectively. The achievable tuning range was designed, as seen in FIG. 8A, to exceed that the minimum required range was to be able to accommodate potential manufacturing related variations.

Having determined the required inductance variation range, Equations (3)-(7) are used as a starting point in the initial stages of the inductor design. M11 and M12 are the most critical transistors forming the core of the gyrator-c network-based active inductor concept. FIG. 9 illustrates a table that summarizes how the transconductance variation of these transistors affects the active inductance, series resistance, and frequency range. The well-known equation $gm=2K(W_{11,12}/L_{t11,12})I)^{1/2}$ (where C is the process transconductance parameter, W is transistor width, $L_t$ is transistor length, and I is the IB) relates transconductance to the transistor size and IB. Changing the IB to change transconductance for inductance tuning also affects the operational frequency range of the inductor and therefore the frequency range needs to be adjusted by properly sizing the M11 and M12 transistors. It is also assumed that the series and parallel capacitances of the all-pass network 109, denoted by Cs and Cp in FIG. 1, are in parallel with the parasitic capacitances of the transistors and contribute to $C_L$ thereby impacting the inductance. The values of Cs and Cp are 1.8 and 6.8 pF, respectively at the center frequency of 2.25 GHz. In estimating the transconductance range, the transistor sizing and achievable inductance tuning range via IB control must be investigated by utilizing circuit and layout models associated with the fabrication process to account for critical parasitic effects. In doing so, the quality factor and operational frequency range of the active inductor must also be considered since the transistor sizes can be reduced to increase L but this in turn impacts $R_s$ and $\omega z$ as indicated in Equation (3). Consequently, the M11 and M12 sizes are best determined through circuit and layout modeling. In these modeling steps, the inductance value is extracted from the S-parameters of the entire all-pass network. Specifically, these transistors exhibited $gm_{11,12}$=0.9 mS and $gm_{11,12}$=2.8 mS at the 850 μA and 2.7 mA IB levels. Transistors M15 and M16 serve as current mirrors to vary the gm of M11 and M12 to tune the inductance.

Once M11 and M12 sizes are determined to achieve the necessary inductance values, the next design step is to minimize the series resistance of the equivalent RF network in an effort to further increase the quality factor of the active inductor. In the DA1 network 700 shown in FIG. 7, transistors M13 and M14 form the negative resistance network and are customarily sized to be identical with equal transconductance. Since sources of the active inductor transistors and drains of the negative resistance transistors are connected to each other (e.g., M11 and M13), they are biased with the same current. Therefore, the smallest IB (i.e., 850 μA) is used to tune the inductor results in the largest absolute value of negative resistance as can be observed in Equation (5) with the opposite occurring for the largest IB (i.e., 2.7 mA). Hence, transistors M13 and M14 are sized to produce a negative resistance to minimize the series resistance of the network under the 850-μA 1B condition. Specifically, the transistor sizes were determined in a way to keep the total series resistance of the entire all-pass network slightly above zero (~5Ω) in order to increase the quality factor while retaining a positive resistance margin to prevent the occurrence of oscillations due to fabrication tolerances. Stability simulations were also conducted and $R_d$ of 100Ω was added to the network to ensure unconditional stability. It is important to note that addition of $R_d$ does not impact the Q performance as it is in parallel with the total series resistance. Since, the negative resistance circuit is also in parallel with the active inductor, it has a minimal impact on the inductance value and its frequency behavior.

The phase shifter 100 was verified as being unconditionally stable and this was achieved by the inclusion of $R_d$ in FIG. 7. This ensures that the total resistance of the inductor stays positive. Not including this resistor also makes the inductor stability more susceptible to the total transistor resistance fluctuations due to process variations. Total parasitic capacitance variations of the transistors due to process variations can be accounted for in Equations (6)-(8) as they affect the value of $R_s$. However, such impact is minimal since the inclusion of the negative resistance network makes $R_s$ negligible as explained in Equation (5) and FIG. 6. Additional effects of process variations and sensitivity on design specifications could be implemented in a design of experiments setup to identify the most sensitive components in the design.

Figure 8B:
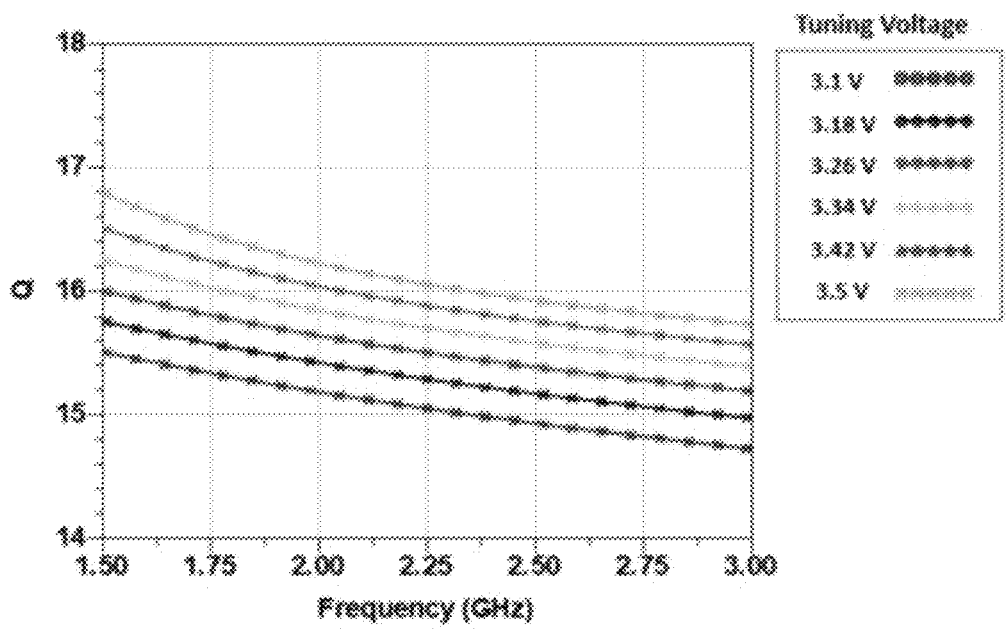
FIG. 8B illustrates an example of a graphical representation of the quality factor variation of the active inductor circuit of FIG. 7 according to various embodiments of the present disclosure.

Once the above procedure is completed for achieving the inductance tuning range at the center frequency, the entire tunable active inductor circuit must be investigated for its frequency-dependent behavior. This observation reveals that the frequency range should be enhanced by introducing the feedback resistors $R_f$ shown in FIG. 7. Since, the feedback resistors change the voltage attenuation factor α, the achievable inductance tuning range is also impacted as indicated by Equation (6). Moreover, the desired inductance tuning per control voltage is not identical across the frequency band as already mentioned. This necessitates parametric studies and optimizations to achieve the desired inductance tuning across the operation bandwidth while maintaining the quality factor and stability performance. The interrelationship among the key circuit parameters utilized in the parametric studies and optimizations performed for the present disclosure are summarized in FIG. 9, The value of $R_f$ was determined as 70Ω from simulation. The appropriate value was selected by running a simulation and sweeping the value of $R_f$ while trying to remain within the limits of inductance value that were previously determined for the phase shifter. FIG. 10 illustrates a table showing the transistor sizes of the optimized circuit, Full-wave layout simulations were performed using the Keysight ADS Momentum suite to account for parasitic effects, Optimization of the transistor size as mentioned previously resulted in achievement of the desired tuning range of inductance over a frequency range from 1.5 to 3 GHz as shown in FIG. 8A for tuning voltage varying from 3.1 to 3.5 V. Unconditional stability was achieved with a stability factor >1 and stability measure >0 across the entire frequency range. The quality factor is shown in FIG. 8B, ranging from 14.8 to 17.5. These simulation results demonstrate that this approach can be used as an alternative to passive inductors in applications where inductance tunability is advantageous, such as in the design of tunable all-pass or matching networks.

Output VGA/Buffer

Figure 11:
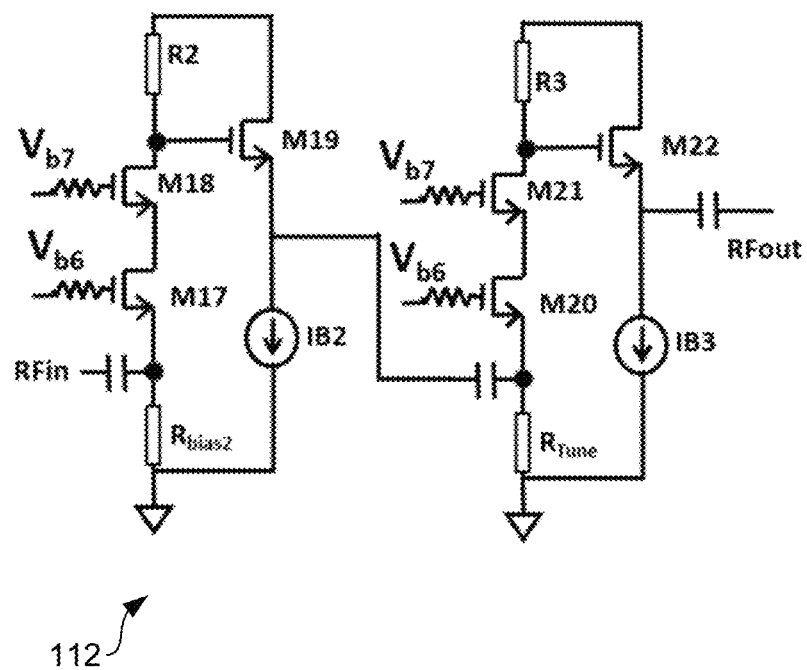
FIG. 11 illustrates an example of a circuit schematic of an output VGA/buffer according to various embodiments of the present disclosure.
Figure 12:
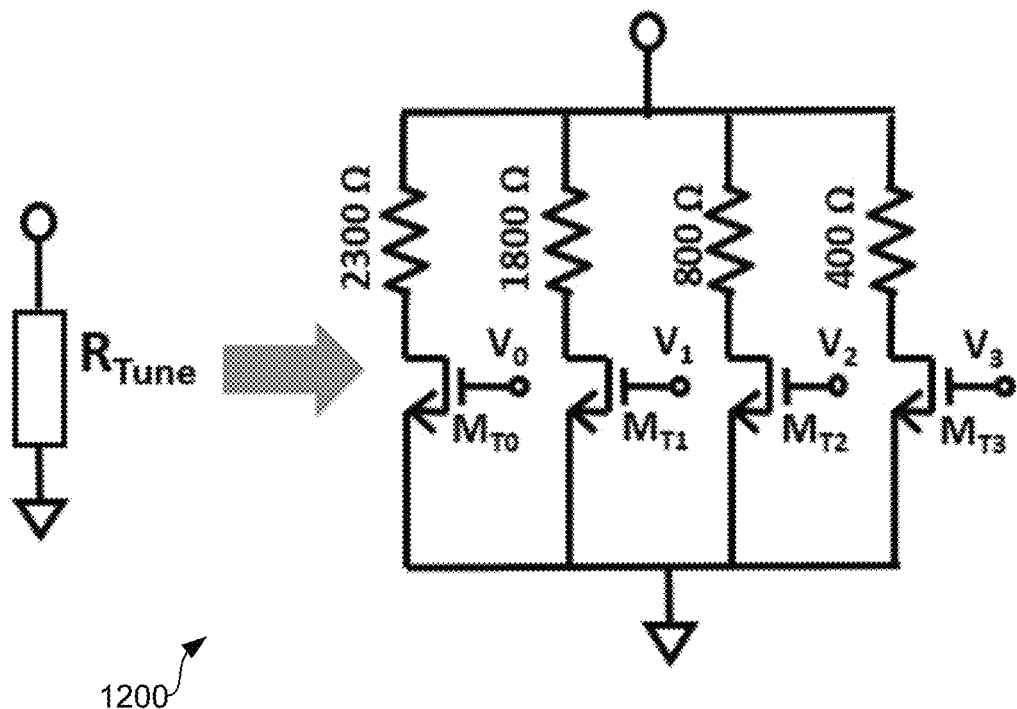
FIG. 12 illustrates am example of a circuit schematic of a resistive tuning network according to various embodiments of the present disclosure.

The last stage of the functional block diagram consists of VGA/buffer circuits 112 as shown in FIG. 11. The first block of the VGA/buffer circuit 112 is a CG amplifier that provides a constant 25-Ω load impedance to the output of the active tunable inductor-loaded all-pass network 109. The first cascade and emitter follower (M17, M18, and M19) serve as a buffer to isolate the active all-pass network 109 from the actual VGA 112 (M20, M21, M22, and so phase shift is not affected as gain is adjusted. Given that the input impedance of the CG amplifier M17 is approximately equal to $1/gm_{17}$ the impedance value can be set by adjusting IB and/or transistor size. The operating point is adjusted using the bias at the source terminal which in this case is implemented by using a resistor $R_{bias2}$ that sets the IB of M17. The transistor size used was $W/L_f=33/0.5$ μm with two fingers. $R_{bias2}$ is selected as 700Ω for a IB of 1.2 mA. M18 and M19 are sized the same as M17 with $V_{b6}$ set to 1.4 V and $V_{b7}$ set at 2.5 V. The second block of the VGA/buffer circuit 112 is another CG amplifier similar to the first but with a variable resistance at the source (i.e., source of transistor M20) to tune the gain for compensating the S21 variations across the different phase shift values. The resistive tuning network 1200 is shown in FIG. 12 and comprises of four parallel resistors that can be used as $R_{Tune}$ by activating appropriate switches $M_{T0}$-$M_{T3}$($W/L_f=50/0.5$ μm with number of fingers=2). The different resistor values vary the IB through the CG amplifier M20 and can be used to vary the voltage gain, which in a first-order approximation becomes $$AV \approx gm_{20} \times R3 \qquad (12)$$

Figure 13:
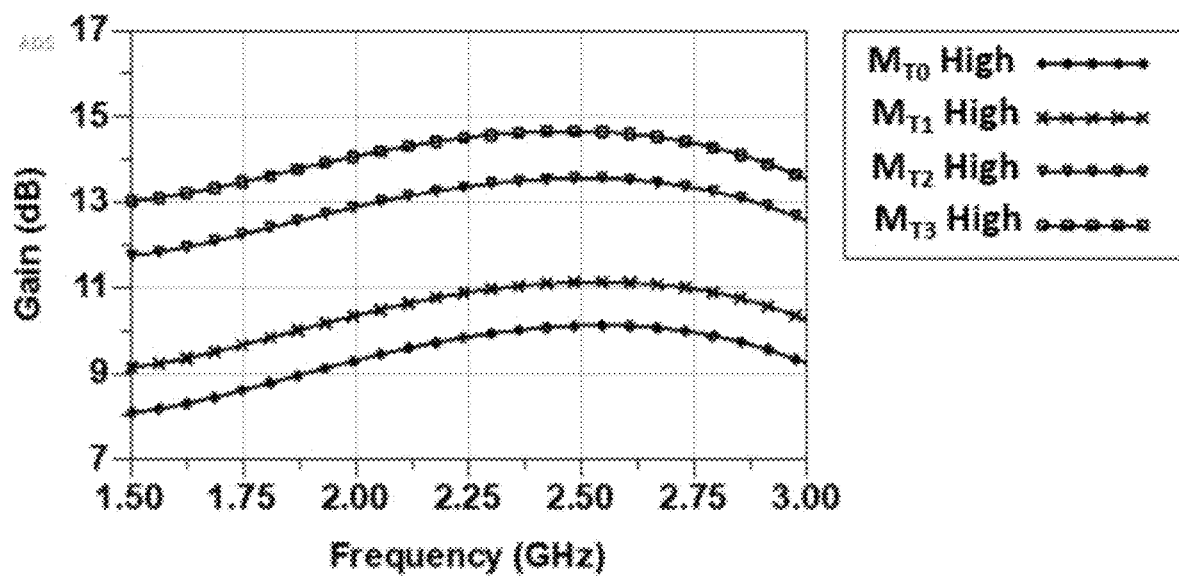
FIG. 13 illustrates an example of a graphical representation showing the simulated gain of the designed VGA/buffer circuit according to various embodiments of the present disclosure.
Figure 14:
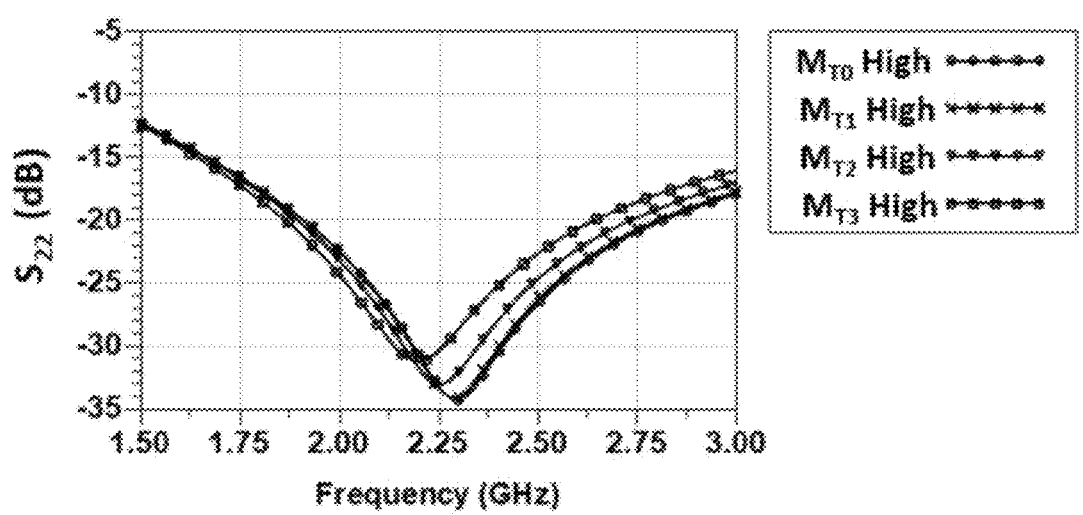
FIG. 14 illustrates an example of a graphical representation showing the S22 of the VGA/buffer circuit according to various embodiments of the present disclosure.
Figure 15:
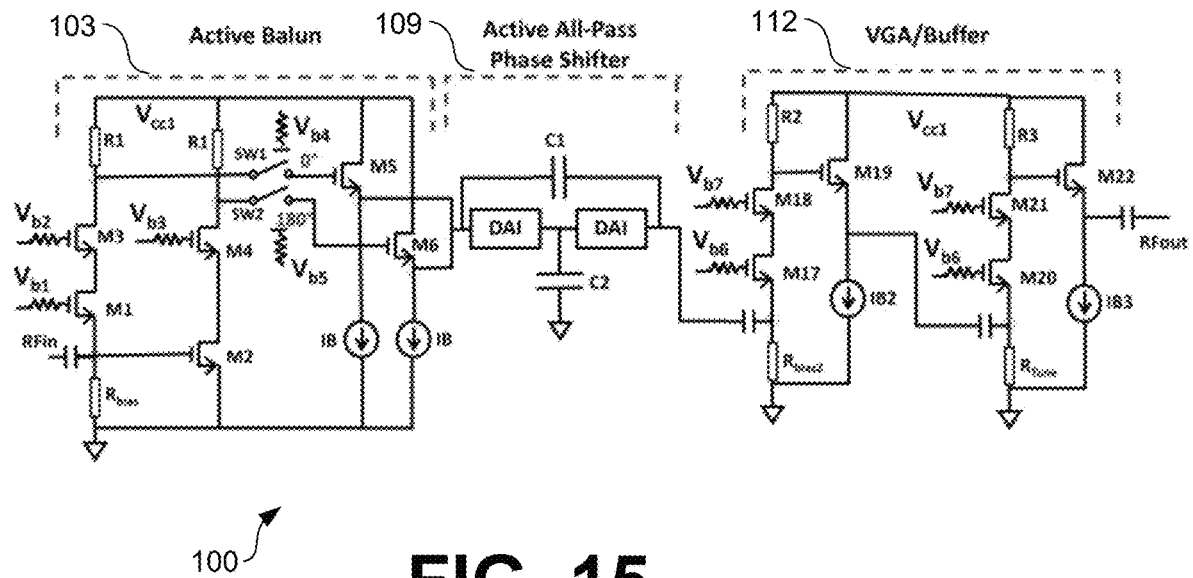
FIG. 15 illustrates an example of a circuit schematic of the phase shifter according to various embodiments of the present disclosure.
Figure 16:
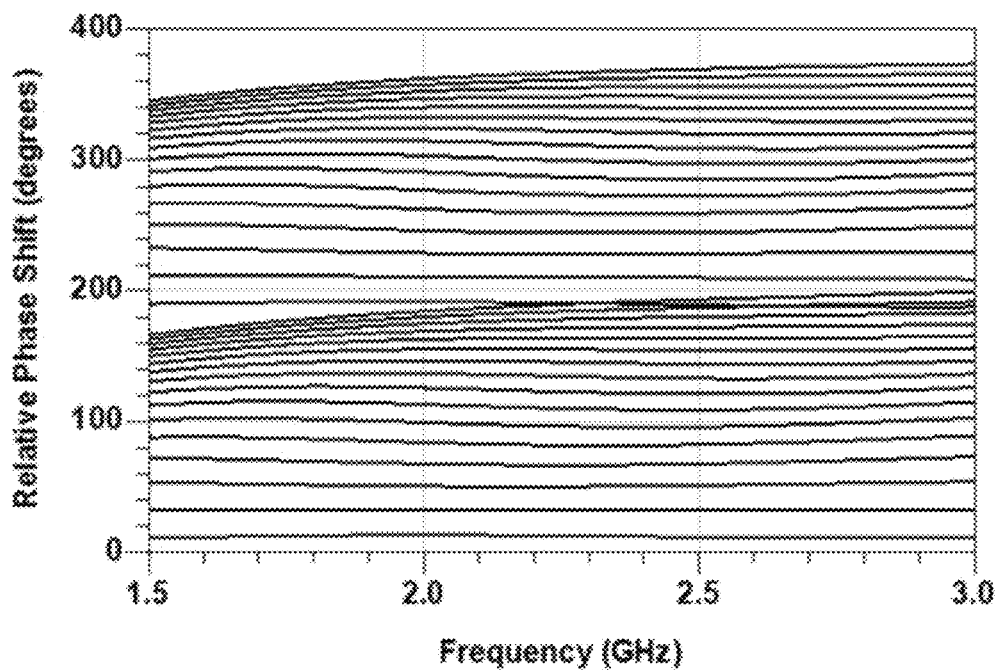
FIG. 16 illustrates an example of a graphical representation showing the simulated phase shift performance of the phase shifter according to various embodiments of the present disclosure.

Based on the resistor value chosen, the IB varies from 0.4 to 3.5 mA for a voltage gain variation from 8 to 15 dB. Within this range, using the four resistor network, fifteen (15) discrete gain steps are available with ~0.5 dB steps. The output buffer is designed to provide a wideband 50-Ω output match using the same approach pursued at the input of the CG amplifier. However, transistor M22 is sized as $W/L_f=20/15$ μm with number of fingers=2 and an IB of 3 mA to achieve a 50-Ω output impedance. Bias current sources IB2 and IB3 are implemented using CS transistors (15/0.5 μm, number of fingers=2) with external voltage applied to the gate, both providing 3-mA IB, The simulated performance of the VGA/buffer layout is shown in FIGS. 13 and 14. FIG. 13 illustrates an example of a graphical representation of the simulated gain of the VGA/buffer layout. FIG. 14 illustrates an example of a graphical representation of the S22 of the designed VGA/buffer circuit 112. The complete schematic of the entire phase shifter 100 is shown in FIG. 15 where all components and interconnects are implemented on a chip. The simulated phase shift performance of the design layout is shown in FIG. 16 according to various embodiments of the present disclosure. Greater than 360° phase shift is achieved across the entire frequency range with a mean gain of 13 dB. The simulated input- and output-return losses are >13 dB across the entire frequency range. In FIG. 15, the simulated voltage gain of the active balun 103 is 10 dB while the active all-pass phase shifter 100 has an average simulated loss of 5 dB with the VGA/Buffer 112 providing an average voltage gain of 8 dB. The all-pass network 109 as a stand-alone unit is bidirectional which with implementation of double-pole double-throwitches could also be used in a transceiver. The success achieved with the simulated performance motivated the experimental verification of the designed phase shifter 100 as detailed in the following section.

Experimental Verification

Figure 17A:
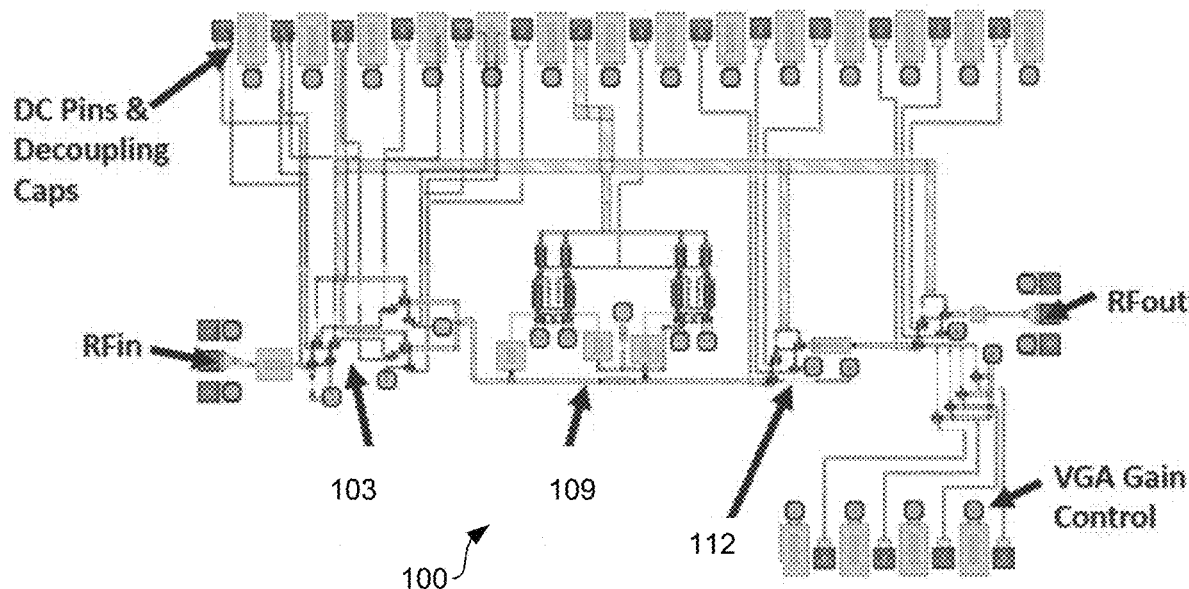
FIGS. 17A and 17B illustrate examples of the fabricated phase shifter of FIG. 15 according to various embodiments of the present disclosure.
Figure 17B:
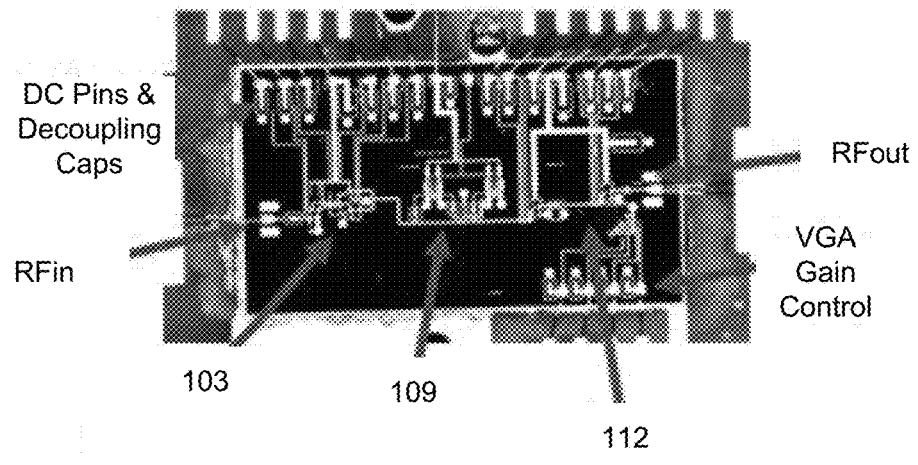
Figure 18:
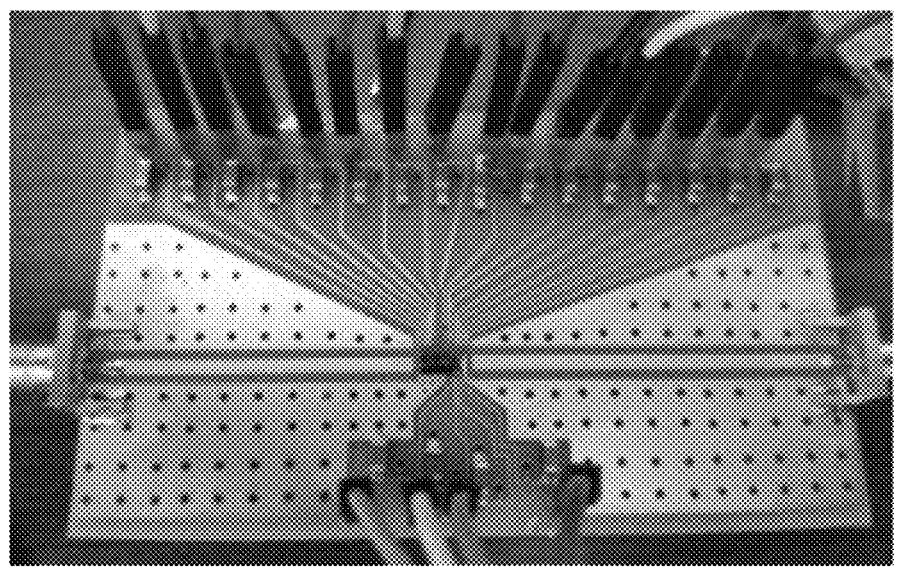
FIG. 18 illustrates an example of the fabricated phase shifter of FIG. 15 on a test board according to various embodiments of the present disclosure.

As shown in FIGS. 17A and 17B, the phase shifter 100 was implemented in the 0.5-μm TRIQUINT® TQPED GaAs process with a chip size of 2.7×4.5 mm² including all bias lines and bond pads (1×3.95 mm² without the bond pads). The chip is mounted on a test board (see FIG. 18) that utilizes grounded coplanar waveguides for input-output RF excitations and narrower conductive traces for dc bias and control. The test board is an 8.1×4.8 cm2 0.79-mm-thick FR4 board. All traces on the test board were fabricated using 1 oz. copper with Electroless Nickel Electroless Palladium Immersion Gold surface finish to allow for the addition of wire bonds. The RF input and output pads of the chip are wedge wire bonded to the test board with two parallel 18-μm-diameter gold wires to minimize the parasitic series inductance associated with the wire bonds. The 20-pF decoupling capacitors of the circuit are implemented on chip. The test board also utilizes 1-pF 0603 and 0.1-pF 0201 sized surface mount decoupling capacitors in order to provide low-frequency filtering and a low impedance path to ground for any high-frequency signals on the dc bias lines. The 50-Ω SubMiniatue version A (SMA) connectors are attached to both the input and output RF ports to facilitate the measurements while the four wire connectors $V_{0-3}$ (FIG. 12) on the bottom are used to vary the gain of the VGA. The top part of the board consists of dc bias connections used to bias $V_{b1-9}$ and $V_{c11}$ in FIG. 15 as well as to vary the tuning voltage $V_b$ of the active inductor (FIG. 7). The gain is varied via the VGA 112 to minimize gain errors around the center frequency of 2.25 GHz. The VGA settings used for each phase shift state are derived from the circuit and layout simulations and depend on the gain variation between reference and phase state.

Figure 20A:
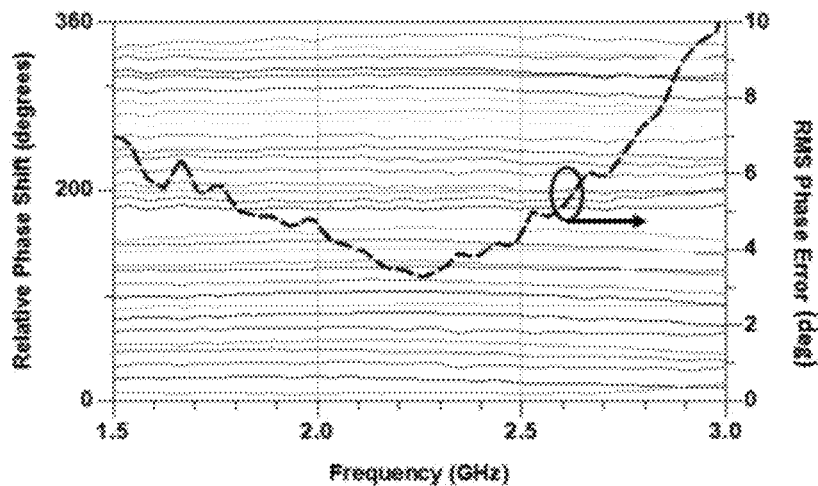
FIGS. 20A-20C illustrates examples of graphical representations of the measured performance of the phase shifter of FIG. 15 according to various embodiments of the present disclosure.
Figure 20B:
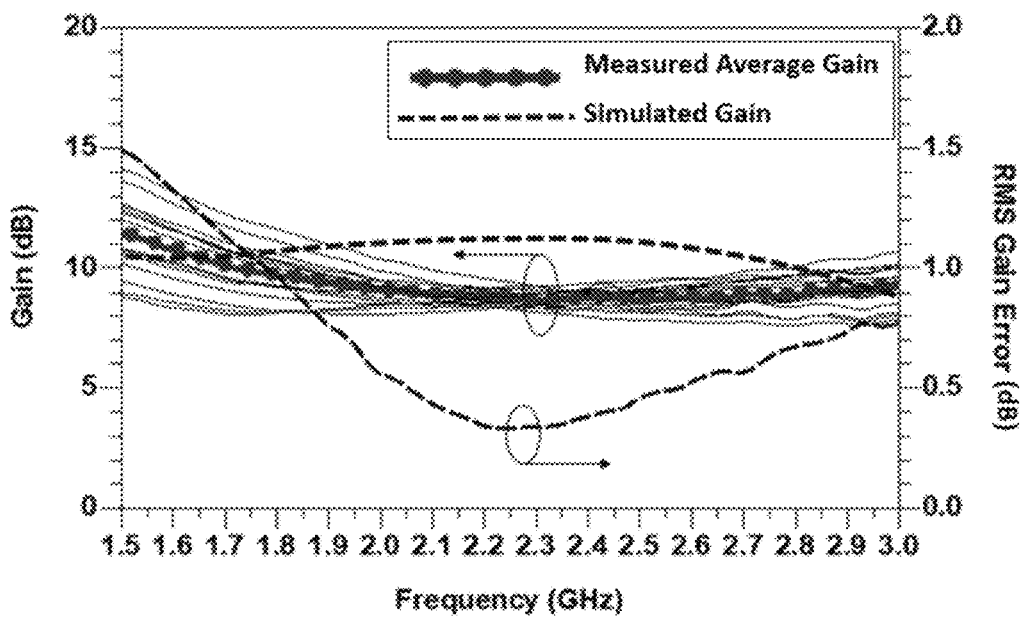
Figure 20C:
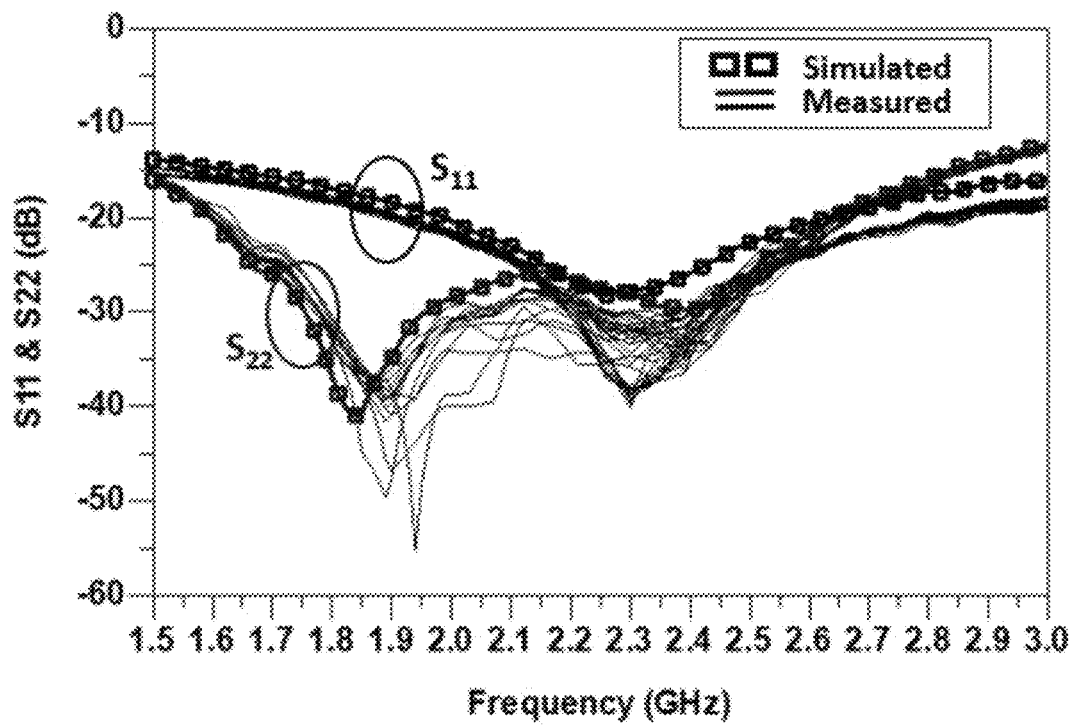
Figure 21:
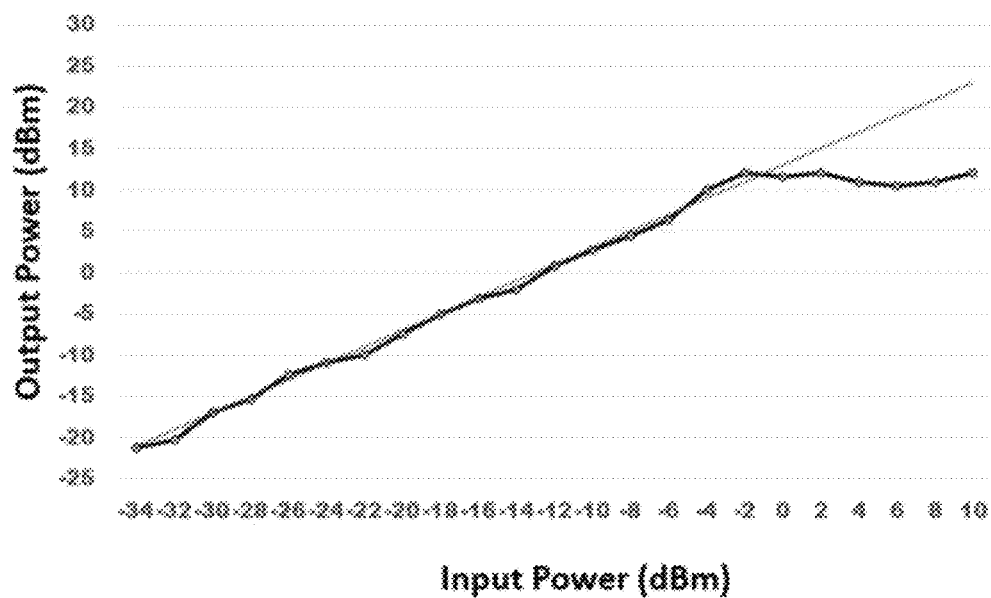
FIG. 21 illustrates an example of a graphical representation of the measured performance for high gain setting according to various embodiments of the present disclosure.

FIG. 20A illustrates an example of a graphical representation of the measured phase response covering the entire 360° range as well as the rms phase error. The input balun/180° phase shifter was set to the 0° phase shift option by activating switch SW1 in FIG. 15. The tuning voltage of the active inductor ($V_b$, FIG. 7) was varied in 30 mV increments from 3.1 to 3.5 V for phase shifts up to 180°. To achieve the next consecutive 180° phase shift for a full 360°, switch SW2 of 180° phase shifter was activated instead of SW1. The rms phase error is calculated using $$\theta_{\Delta,RMS} = \sqrt{\frac{1}{N-1}\sum_{i=2}^{N}|\theta_{\Delta i}|^2} \qquad (13)$$

where N is the number of phase states used to achieve a 360° phase shift, and $\theta_{\Delta i}$ is the phase difference between simulated and measured phase shift for 32 distinct phase states equivalent to a 5-b phase shifter. The rms phase error ranges from 5° to 9° over the entire frequency range. Results observed in FIG. 20A show that phase shift is not uniform across the entire frequency range. For instance, from 1.5 to 2 GHz there is not coverage from approximately 150° to 180°. However, it should be remarked that the presented design is a continuous phase shifter 100 and finer phase tuning can be achieved with smaller voltage increments. In addition, it is important to note that a more robust solution could also be achieved by cascading another all-pass network stage and designing these all-pass networks for different center frequencies within the 1.5- to 3-GHz frequency range. This cascading approach would decrease the inductance requirements and result in flatter phase response, but would also require larger chip area and power consumption. FIG. 20B shows the measured gain for the different measured phase shift states depicted in FIG. 20A along with the average gain. The measured rms gain error, calculated using $$A_{\Delta,RMS} = \sqrt{\frac{1}{N}\sum_{i=1}^{N}|A_{\Delta i}|^2} \qquad (14)$$

is also shown in FIG. 20B where $A_{\Delta,RMS}$ is the RMS amplitude error. RMS gain error <1.5 dB was obtained. FIG. 20C presents the measured $S_{11}$ and $S_{21}$ performances of the phase shifter. The difference between measured and simulated gain can be attributed to additional losses of RF traces on the test board, as these were not accounted for in simulation. These data demonstrate that impedance matching is satisfied with >15 dB return losses across the frequency range and are independent of the phase shifter state due to the functionalities of the active balun 103 acting as an input buffer and VGA 112 cascaded with an output buffer. Measured results show an input 1-dB compression point (P1 dB) of –1 and –2 dBm at 1.5 GHz for the low and high gain settings of the VGA 112, respectively. At 3 GHz, the measured P1 dB is –1 and 0 dBm for the low and high gain settings of the VGA, respectively. As an example, FIG. 21 presents the measured P1 dB performance at 3 GHz for the high gain setting of the VGA 112 and demonstrates a P1 dB value of 0 dBm. The total current consumption of the active balun 103, active tunable inductor-loaded all-pass network 109, and output VGNbuffer 112 is 8, 3.4, and 8 mA, respectively. The do supply voltage is 4 V and results in a total power consumption of 78 mW for the phase shifter. FIG. 19 illustrates a table that summarizes the measured performance of the phase shifter 100 and compares it with performances of the previously published state-of-the-art MMIC phase shifters that are tailored toward L- and S-band applications. The 67% fractional bandwidth of the presented design outperforms that of the others given in the table of FIG. 19. Its footprint is larger than the phase shifter presented in M. Hangai, M. Hieda, N. Yunoue, Y. Sasaki, and M. Miyazaki, "S- and C-band ultra-compact phase shifters based on all-pass networks," IEEE Trans, Microw. Theory Techn., vol. 58, no. 1, pp. 41-47, January 2010 (hereinafter "Hangai et al."), C. Lu, A.-V. H. Pham, and D. Livezey, "Development of multiband phase shifters in 180-nm RF CMOS technology with active loss compensation," IEEE Trans. Microw. Theory Techn., vol. 54, no. 1, pp. 40-45, January 2006 (hereinafter "Lu et al."), and T. M. Hancock and G. M. Rebeiz, "A 12-GHz SiGe phase shifter with integrated LNA," IEEE Trans. Microw. Theory Techn., vol. 53, no, 3, pp. 977-983, March 2005 (hereinafter "Hancock et al,"). However, the presented phase shifter has 10-dB gain in addition to its significantly larger bandwidth. The rms gain error is on-par with the other phase shifters. The rms phase shift error is larger than desired but can potentially be reduced in the future iterations with the addition of a 90° phase shifter in conjunction with the 180° balun already used. This design change would require less tuning range in the active inductor. The phase shifters presented in J.-C. Jeong, D. Shin, I. Ju, and I.B. Yom, "An S-band multifunction chip with a simple interface for active phased array base station antennas," ETRI J., vol. 35, no. 3, pp. 378-385, June 2013 (hereinafter "Jeong et al.) and A. P. de Hek, M. Rodenburg, and F. E. van Vliet, "Low-cost S-band mufti-function MMIC," in Proc. Eur. Microw. Integr. Circuit Conf., October, 2008, pp. 262-265 (hereinafter "de Hek et al.) provide large gains; however, they also occupy more chip area than the presented design. In addition, power consumption of the phase shifter in Jeong et al. is 500 mW, which is more than six times the consumption of the presented design. Measured results show an output P1 dB of 12 dBm which is similar to the designs in Jeong et al and de Hek et al., but less than the passive design in Hangai et al. which has 6.5-dB insertion loss. The phase shifter in Hancock et al. has an output P1 dB of –27.3 dBm but operates at a higher frequency.

A novel compact and wideband phase shifter concept based on tunable active inductor-loaded all-pass networks has been introduced and experimentally verified for potential S- and L-band applications. Specifically, the presented phase shifter 100 has 1×3.95 mm² die area without bond pads and operates within the 1.5 to 3 GHz band with 10-dB gain, less than 1.5-dB rms gain error and less than 9° rms phase error. A comparison with the state-of-the-art MMIC phase shifters operating in 3- and L-bands demonstrates that the presented phase shifter exhibits a remarkable bandwidth performance from a very compact footprint with low-power consumption. Although the phase shifter 100 is implemented using a GaAs MMIC process, the concept is suitable to be implemented on silicon processes as the functionality of the active inductors has already been successfully verified. Linearity performance might be the only advantage in using GaAs over a silicon process such as CMOS since the limiting factor for linearity in this network could be that of the active inductors. In addition, the compact circuit area of the presented concept is promising to include additional all-pass network segments within the design to further increase the bandwidth performance, potentially to cover a decade or more. The utilized GaAs process includes both enhancement and depletion mode pHEMT devices which can be facilitated to design digital serial to parallel converter to reduce number of interfaces for phase control similar to that of CMOS.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A phase shifter, comprising:
    an active balanced-to-unbalanced (balun) circuit being configured to split an input signal into two signals offset in phase;
    an active all-pass network electrically coupled to an output of the active balun circuit, the active all-pass network comprising an active tunable inductor; and
    a variable-gain amplifier (VGA) electrically coupled to an output of the active all-pass network.

2. The phase shifter of claim 1, wherein the active balun circuit comprises two transistor switches, a first transistor switch corresponding to a first signal of the two signals and a second transistor switch corresponding to a second signal of the two signals, the first signal and the second signal being offset by about 180°.

3. The phase shifter of claim 2, wherein the output of the active balun circuit corresponds to an active transistor switch of the two transistor switches.

4. The phase shifter of claim 2, further comprising two output buffers configured to isolate the active balun circuit from the active all-pass network, a first output buffer being electrically coupled to an output of the first transistor switch, and a second output buffer being electrically coupled to an output of the second transistor switch.

5. The phase shifter of claim 1, wherein the all-pass network is configured to adjust a phase of an all-pass network input signal within a range of 0-180°.

6. The phase shifter of claim 1, wherein the active tunable inductor comprises two cross-coupled transistors, and inductance tunability is based at least in part on varying the transconductance value of each of the two cross-coupled transistors.

7. The phase shifter of claim 6, wherein the phase shifter is tunable in a range of about 1.6 nH to about 4.3 nH at about 1.5 GHz.

8. The phase shifter of claim 6, wherein the phase shifter is tunable in a range of about 0.9 nH to about 2.2 nH at about 3 GHz.

9. The phase shifter of claim 1, wherein the VGA comprises a common-gate amplifier configured to provide a constant load impedance to the output of the active all-pass network.

10. The phase shifter of claim 9, wherein the VGA further comprises another common-gate amplifier configured to balance gain variations among phase shift values.

11. The phase shifter of claim 1, wherein an output signal of the VGA is offset in phase by about 360° from the input signal of the active balun circuit.

12. A method for shifting a phase of a signal, comprising:
    splitting, via an active balun circuit, an input signal into two signals offset in phase;
    selecting one of the two signals based on a phase shift; and
    tuning, via an active all-pass network including an active tunable inductor, a phase of the selected signal within a range of 0-180°.

13. The method of claim 12, wherein the active balun circuit comprises two transistor switches, a first transistor switch corresponding to a first signal of the two signals and a second transistor switch corresponding to a second signal of the two signals, and further comprising activating one of the two transistor switches, selection of the one of the two signals being further based on activation of the one of the two transistor switches.

14. The method of claim 12, wherein the two signals are offset by about 180°.

15. The method of claim 12, further comprising balancing gain variations among phase shift values.

16. A phase shifter, comprising:
    a balun circuit configured to split an input signal into two signals offset in phase by about 180°; and
    an active all-pass network configured to adjust a phase of a balun output signal of the balun circuit within a range of 0-180°, the active all-pass network being electrically coupled to an output of the balun circuit, the balun output signal comprising one of the two signals offset in phase, and the active all-pass network comprising an active tunable inductor including two-cross-coupled transistors for adjusting the phase of the balun output signal.

17. The phase shifter of claim 16, wherein the phase shifter is at least one of: tunable in a range of about 1.6 nH to about 4.3 nH at about 1.5 GHz or tunable in a range of about 0.9 nH to about 2.2 nH at about 3 GHz.

18. The phase shifter of claim 16, further comprising a variable-gain amplifier (VGA) electrically coupled to an output of the active all-pass network.

19. The phase shifter of claim 18, wherein a VGA output signal of the VGA is offset in phase by about 360° from the input signal of the balun circuit.

* * * * *